United States Patent [19]

Paurus et al.

[11] Patent Number: 5,448,511
[45] Date of Patent: Sep. 5, 1995

[54] MEMORY STACK WITH AN INTEGRATED INTERCONNECT AND MOUNTING STRUCTURE

[75] Inventors: Floyd G. Paurus, Boulder; Stanley R. Szerlip, Longmont, both of Colo.

[73] Assignee: Storage Technology Corporation, Louisville, Colo.

[21] Appl. No.: 252,609

[22] Filed: Jun. 1, 1994

[51] Int. Cl.⁶ .................. G11C 5/04; G06K 19/07
[52] U.S. Cl. ......................... 365/52; 365/63; 257/686; 361/749; 439/77
[58] Field of Search ............... 365/52, 53, 63; 361/749, 750, 751; 257/686, 684, 685, 777; 439/77, 67

[56] References Cited

U.S. PATENT DOCUMENTS

| | | | |
|---|---|---|---|
| 3,766,439 | 10/1973 | Isaacson | 361/750 X |
| 5,117,282 | 5/1992 | Salatino | 361/749 X |
| 5,313,416 | 5/1994 | Kimura | 365/52 |
| 5,335,145 | 8/1994 | Kusui | 361/749 X |

FOREIGN PATENT DOCUMENTS 405013967  1/1993  Japan .................. 361/749

Primary Examiner—David C. Nelms
Assistant Examiner—Son Mai
Attorney, Agent, or Firm—Sterne, Kessler, Goldstein & Fox

[57] ABSTRACT

A memory stack includes a flexible interconnect device having a plurality of rigid sections connected together by a plurality of flexible sections. Memory devices such as dice or chips are mounted on the flexible interconnect structure and the structure is folded to at the flexible sections to form a stack. Connections among memory device I/Os and interconnect device mounting contacts are made via traces in a signal layer. A thermal conduction layer can be added to increase heat conduction away from the memory devices.

34 Claims, 7 Drawing Sheets

MEMORY STACK WITH AN INTEGRATED INTERCONNECT AND MOUNTING STRUCTURE

RELATED APPLICATION

This application is related to a commonly owned application entitled "Low Cost Memory Stack" attorney docket no. 1411.0570000, filed on even date herewith, the full disclosure of which is incorporated herein by reference as if reproduced in full below.

BACKGROUND OF THE INVENTION

1. Field of the Invention

The present invention relates generally to integrated circuit packaging, and more specifically to a memory stack with an integrated interconnect and mounting structure.

2. Related Art

As system designers sought to achieve higher densities in circuit layout, they pioneered the development of three-dimensional memory structures. Such three-dimensional memory structures are commonly known as memory stacks. Memory stacks encompass/span/require less circuit-board surface area because the memory chips are stacked vertically as opposed to laid out horizontally. Thus, while board height may be increased due to circuit stacking, board area is conserved.

Several conventional memory stacks are currently in use. These conventional stacks can best be described through the methods by which they are made. The first memory stack uses specially modified DRAM (Dynamic Random Access Memory) dice manufactured according to the method now described. According to this method, the dice are first exposed to a post process passivation and metalization step to form interconnection leads to the dice edge. The dice are then thinned, to increase density and provide a highly planar dice interface. The dice are then tested and stacked to form a cube. The cube edges are lapped and processed to expose the dice interconnections. Finally, interconnection bonding leads and pads are formed.

According to a second method of producing a memory stack, the RAM dice are wire-bonded to a substrate that is typically a tape form of substrate. The dice are separated, stacked, and bonded to form a cube. After bonding, the cube is cut with a diamond saw to expose the bond wire ends. These cubes are then plated and a laser used to form lands between I/O (Input/Output) and interconnect leads. According to this method, the die/substrate tape may be electrically tested to isolate problem dice prior to stacking and bonding.

A third method of fabrication utilizes conventional DRAM die bonded into a carrier, and wire bonded to I/O pads on the carrier. These loaded carriers are then electrically tested and burned in. After burn-in, the carriers are filled with thermal epoxy and tested again. These filled carriers are then stacked and interfaces are formed on the faces thereof.

Presently, there are no methods for providing burned-in and tested dice when the dice are purchased in water form. As a result, according to the first and second production methods described above, there can be a certain amount of device fall-out due to faults occurring on the wafer. Additionally, there is typically a significant amount tall-out due to the numerous process steps required with these two methods. Furthermore, this great number of process steps tends to increase tile total package cost.

A further drawback of the first two methods is that, because there is no method for assuring that the dice placed onto the stack will survive the subsequent processing, redundant devices must be added into the stack.

The third method for manufacturing memory stacks described above also has disadvantages. One disadvantage is that known good dice are typically priced higher than conventionally-packaged DRAM parts. Additionally, the processing steps, the carriers, and the testing steps raise the cost of these memory stacks.

SUMMARY OF THE INVENTION

The present invention is directed toward a low-cost, thermally-efficient memory stack. The memory stack is made using a flexible or a rigid/flexible interconnect device. According to the invention, memory dice are mounted on the interconnect device and the interconnect device folded in an accordion-like fashion so that the dice are effectively stacked on top of one another. The interconnect device provides electrical signal interconnects among the dice' I/O ports and the printed circuit board on which the stack is mounted.

Further features and advantages of the present invention, as well as the structure and operation of various embodiments of the present invention, are described in detail below with reference to the accompanying drawings.

BRIEF DESCRIPTION OF THE DRAWINGS

The present invention is described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE EMBODIMENTS

1. Introduction and Overview of the Invention

The present invention is directed toward a memory stack comprising a flexible, or a partially rigid/partially flexible, interconnect device with memory devices, such as DRAM dice, mounted thereon. The interconnect device is folded to form a stack of memory devices.

2. Representative Embodiment

Figure 1:
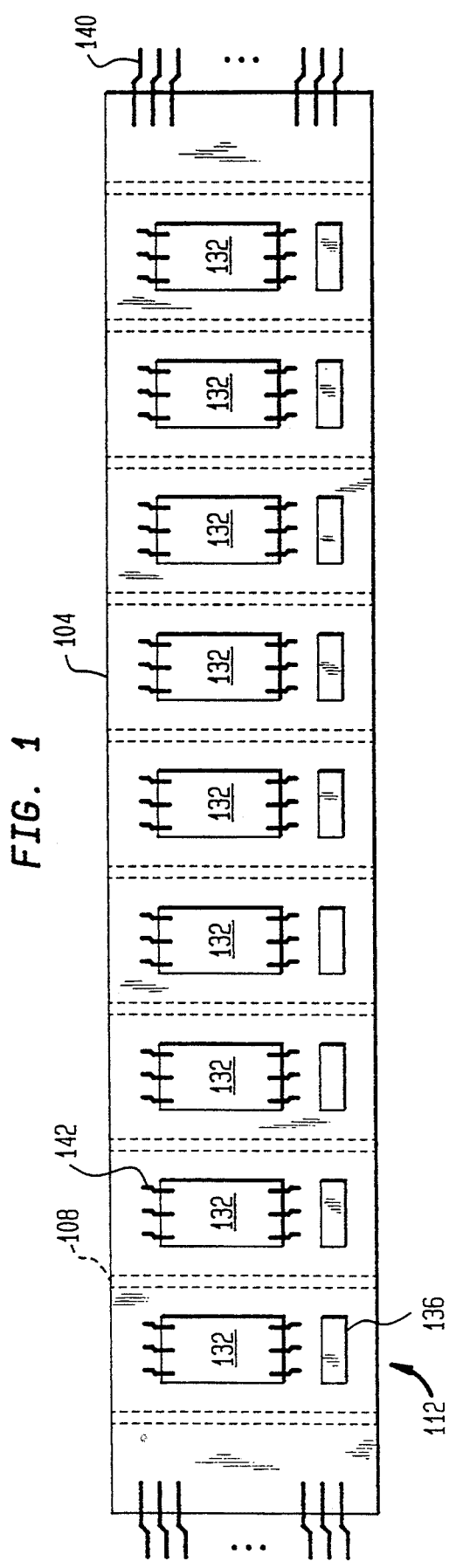
FIG. 1 is a diagram illustrating memory devices mounted on a rigid/flexible interconnect device.

FIG. 1 is a diagram illustrating memory devices mounted on a rigid/flexible interconnect device. Referring now to FIG. 1, an interconnect device 112 provides mounting structure on which the memory devices are mounted. According to one embodiment, the memory devices used are dice 132. A die 132 is chosen for the memory device because of the relatively small footprint of the die. However, the memory device could also be a packaged die mounted in a carrier such as a TSOP (thin small outline package) carrier or other conventional carrier. However, an unmounted, or bare, die is preferred because of its smaller footprint, thin profile, more efficient thermopath and potentially lower cost.

Each die 132 is mounted to interconnect device 112. Alternatives for mounting can include die attach wire bond, flip chip or BGA (Ball Grid Array). A decoupling capacitor 136 can be mounted to interconnect device 112 for each die 132 as illustrated in FIG. 1. In an alternative embodiment, one decoupling capacitor 136 can be provided for a group of dice 132. For example, in this alternative embodiment, one decoupling capacitor 136 may be provided for every five or ten dice 132.

In one embodiment, interconnect device 112 comprises both rigid sections 104 and flex sections 108. In this embodiment, each die 132 is mounted on a rigid section 104. Rigid section 104 is substantially un-bendable, while flexible section 108 is flexible and easily bent. In this embodiment, interconnect device 112 with the dice 132 mounted thereon is folded at flex sections 108 to form a stack of dice 132 (e.g., see FIG. 3)

Interconnect device 112 includes one or more layers of copper traces to provide electrical connection among I/O leads 142 of each die 132 and/or between leads 142 and mounting contacts 140. Mounting contacts 140 provide electrical contact between copper traces of interconnect device 112 and a circuit board, or other device, on which the memory stack is mounted. Attachment of the stack to the mounting surface can include gullwing, BGA and flip chip. As described below, mounting contacts 140 can be leads (as illustrated in FIG. 1) or other contact devices.

Figure 2:
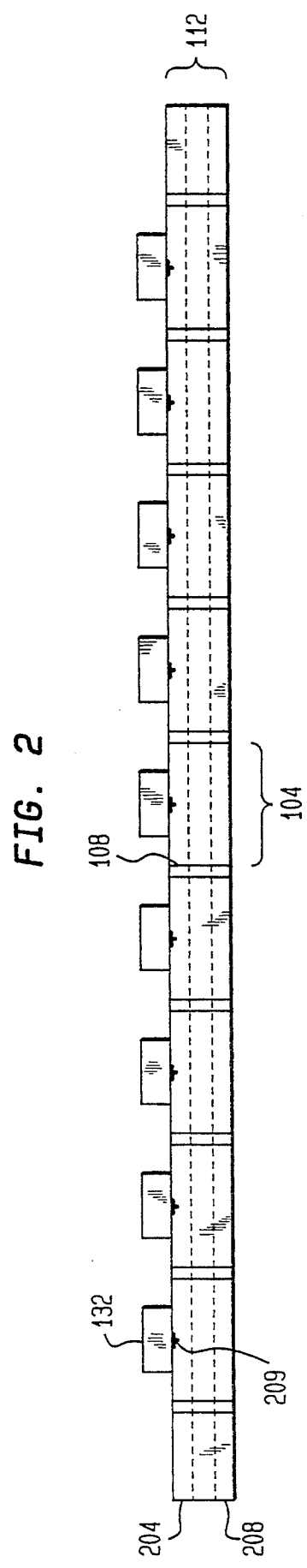
FIG. 2 is a cross section illustrating an interconnect device having dice mounted thereon.

FIG. 2 is a cross section illustrating interconnect device 112 with dice 132 mounted thereon. Referring now to FIG. 2, interconnect device 112 includes one or more internal signal layers 204 and an optional thermal conduction layer 208. Internal signal layer 204 includes copper (or other conductive material) traces to provide the desired interconnection between die leads 142 and mounting contacts 140. The traces can be laid out in internal signal layer 204 to provide a variety of different interconnections depending on the application requirements.

Thermal conduction layer 208 is made of copper, or some other material having desirable heat transfer characteristics to remove heat from dice 132. The thickness of thermal conduction layer 208 is chosen based on the thermal characteristics of the material used for this layer, the amount of heat generated by dice 132, and size constraints on the overall package. The material chosen for thermal conduction layer 208 can be selected while considering the design tradeoffs between cost and heat transfer characteristics. A material with a greater heat transfer capacity can be used to dissipate a given amount of heat in a smaller package. When choosing a material for thermal conduction layer 208, it is important to note that the material should have sufficient malleability so that it can be bent when interconnect device 112 is folded to form the stack.

Thermal conduction layer 208 is illustrated as being separated from dice 132 by internal signal layer 204. In an alternative embodiment, the positions of thermal conduction layer 208 and internal signal layer 204 can be exchanged. This would enhance the heat transfer characteristics of the package. In this alternative embodiment, where an electrically conductive material is used for thermal layer 208, traces in signal layer 204 would require insulated vias or other like pathways through the thermal conduction layer 208.

Thermal vias and thermal pads 209 may be optionally included interconnect device 112 to further aid heat removal.

In FIG. 2, interconnect device 112 is illustrated as having a plurality of rigid sections 104 coupled to one another by flex sections 108. Flex sections 108 allow the rigid sections 104 to be folded on top of one another to form the stack. Alternatively, interconnect device 112 can be made entirely of a flexible material such as flexible printed circuit. Flexible printed circuit is a thin, ribbon-like circuit which is formed by sandwiching a plurality of copper traces between two layers of flexible insulating material, such as polyimide. Polyimide is available from E.I. DuPont De Nemours & Company, Wilmington, Del. Flexible printed circuit materials can be made-to-order (i.e., from customer-supplied specifications) from Rogers Corporation, Flexible Interconnections Division, Chandler, Arz., U.S.A.

3. Single-sided Connection Embodiments

Figure 3:
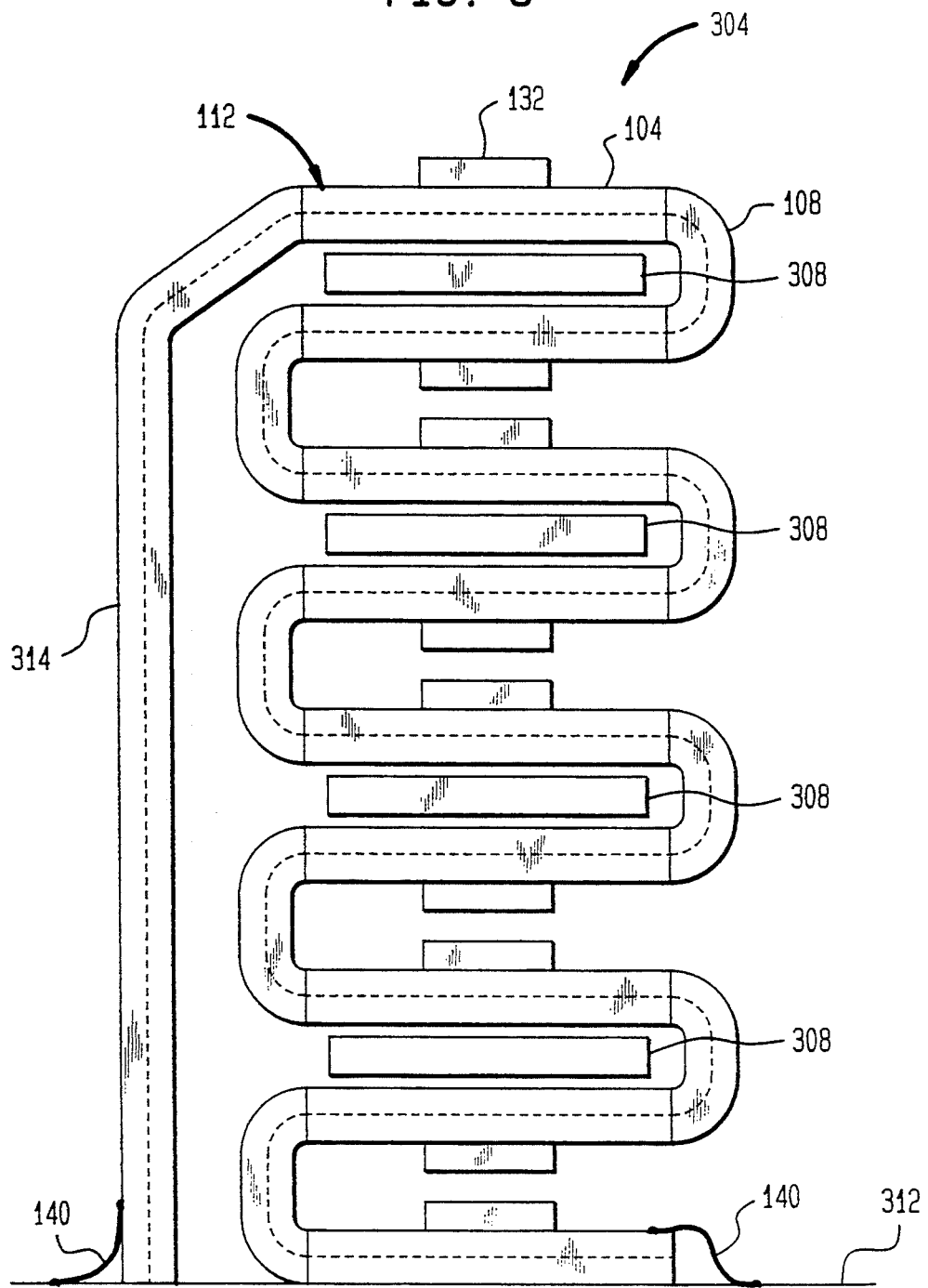
FIG. 3 is a diagram illustrating a cross sectional view of the interconnect device with dice mounted thereon and folded into a memory stack.
Figure 4:
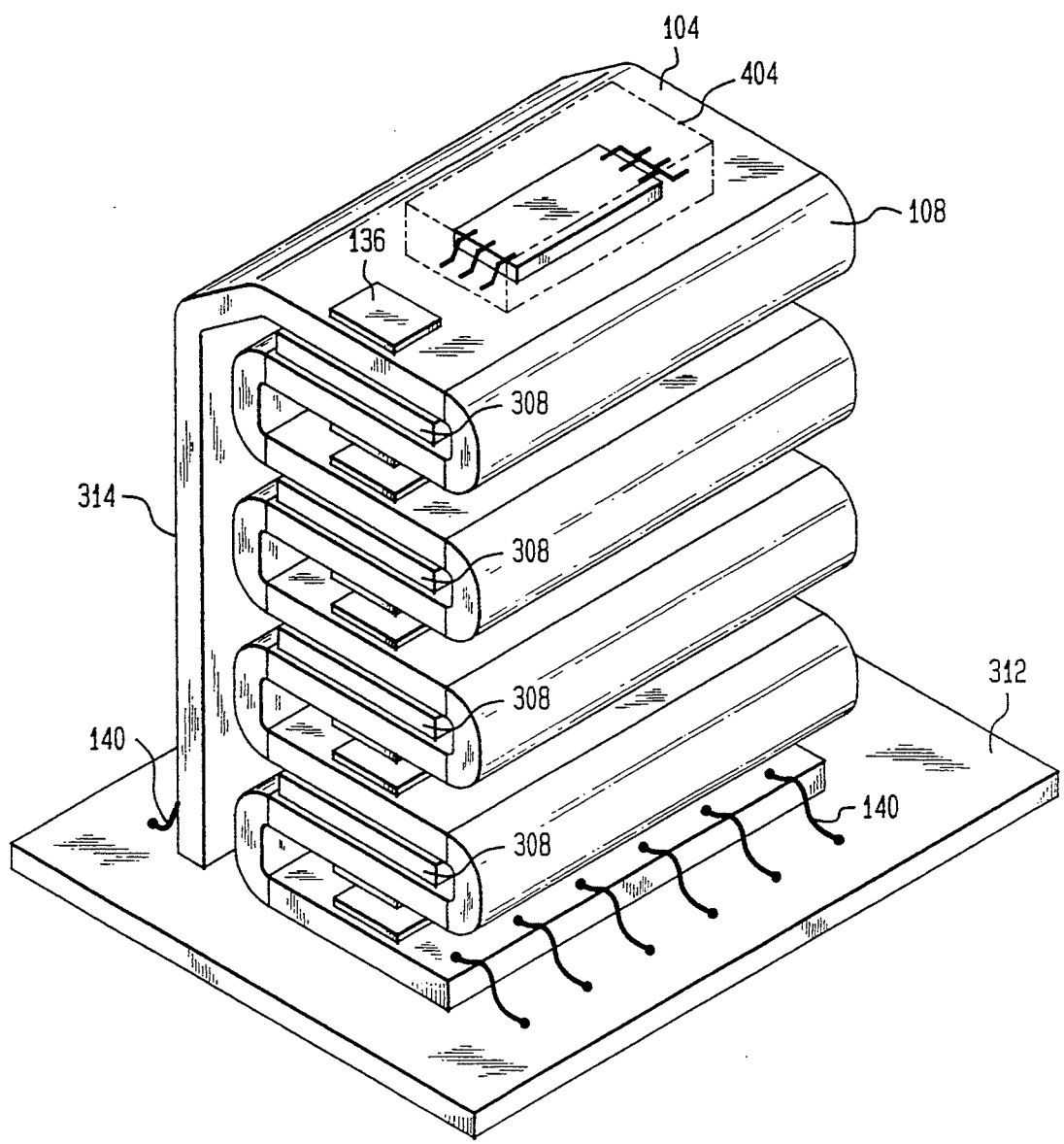
FIG. 4 is a diagram illustrating a perspective view of a memory stack.

FIG. 3 is a diagram illustrating a cross sectional view of interconnect device 112 with die 132 mounted thereon and folded into a memory stack 304. Each die 132 is mounted on a rigid section 104 of interconnect device 112. Each die 132 can include an overmold 404 (illustrated in FIG. 4) or can otherwise be encapsulated for protection. FIG. 4 is a diagram illustrating a perspective view of memory stack 304.

Referring now to FIGS. 3 and 4, interconnect device 112 is folded, preferably in an accordion-like fashion, so that dice 132 are effectively stacked on top of one another. A thermal plane 308 is positioned between folds of interconnect device 112 to help conduct heat away from thermal conduction layer 208 of interconnect device 112. Thermal planes 308 can be bonded in place using a thermal epoxy. Thermal planes 308 can be connected to a heat sink placed over the completed stack to help dissipate heat at a faster rate. Thermal planes 308 can be manufactured using copper or other metal having acceptable heat transfer characteristics. Additional thermal planes 308 can also be inserted between each adjacent pair of dice 132 to aid in the conduction of heat away from those dice 132. In addition, each thermal plane 308 may extend beyond the edge of the interconnect device 112 to provide contact with a heat sink. This allows heat to be removed from the stack 304 at a greater rate.

Mounting contacts 140 are soldered or otherwise electrically connected to a surface of a circuit board 312 on which memory stack 304 is mounted. Circuit board 312 could be a printed circuit board, backplane, or other surface on which memory stack 304 is mounted. Leads 140 may be an integral part of interconnect device 112.

In FIGS. 1, 3 and 4, mounting contacts 140 are illustrated as leads electrically connected to the top surface of interconnect device 112. In alternative embodiments, mounting contacts 140 can be pins, surface mount contacts (e.g., see FIGS. 6, 8 and 9), BGA's or other electrical contacts.

In the embodiment illustrated in FIGS. 3 and 4, an interconnect extension 314 extends from the top of memory stack 304 to the circuit board 312. Traces in the signal layer 204 of interconnect extension 114 provide connections among mounting contacts 142 and mounting contacts 140 as required.

While the above-described embodiments primarily discuss interconnect device 112 as comprising both rigid sections 104 and flex sections 108, alternative embodiments could be implemented using an interconnect device 112 made up entirely of flexible circuit materials, and not having any rigid sections 104. An interconnect device 112 made entirely out of flexible circuit material would be less costly to manufacture. However, rigid sections 104 may be desirable to add stability to the memory stack and also to reduce the amount of flex on leads 142 thereby increasing the integrity of memory of the memory stack. If leads 142 and their connection points are subjected to too much flex, they may weaken and break.

The entire memory stack 304 can be encapsulated to form a sealed package. Adhesive can also be included between dice 132 for additional rigidity and retention.

4. Single-Ended Connection Embodiments

Figure 5:
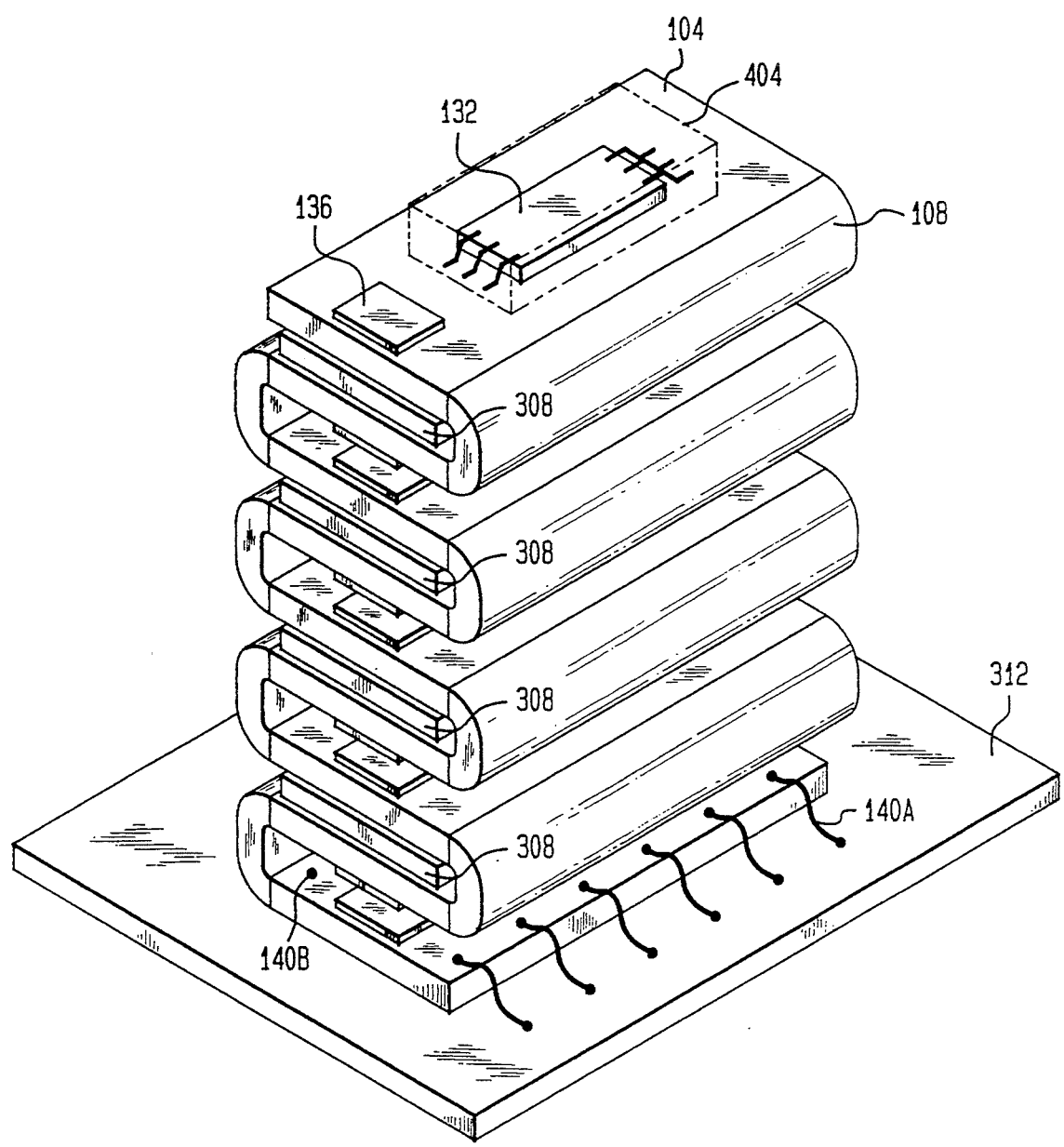
FIG. 5 is a perspective view of an alternative embodiment having a single-ended connection.
Figure 6:
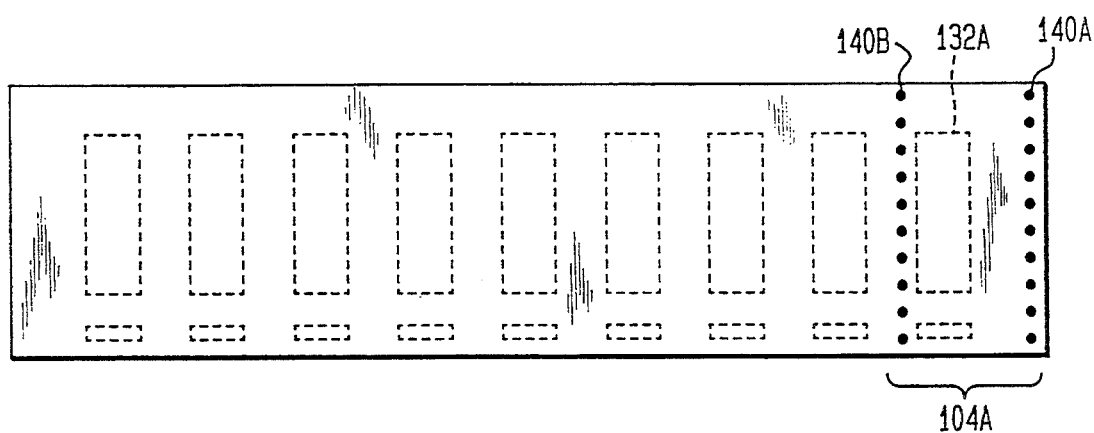
FIG. 6 is a top view illustrating pad mounting contacts to allow mounting the memory stack to the surface of a printed circuit board for the single-ended-connection embodiment.

In the embodiment described in FIGS. 3 and 4, a double-ended connection is illustrated. In this embodiment, mounting contacts 140 at both ends of interconnect device 112 are used to connect memory stack 304 to the surface of printed circuit board 312. In an alternative embodiment, a single-ended connection method is provided without interconnect extension 314. This single-ended connection embodiment is now described with reference to FIGS. 5 and 6. FIG. 5 is a perspective view of this alternative embodiment. FIG. 6 is a bottom view illustrating mounting contacts 140A and 140B to allow mounting the memory stack 304 to the surface of circuit board 312.

Referring now to FIGS. 5 and 6, mounting contacts 140A, 140B are provided on both sides of a die 132A (referred to as end die 132A) at a first end of interconnect device 112 (referred to as end section 104A). These mounting contacts 140A, 140B allow the memory stack 304, when folded as illustrated in FIG. 5, to be electrically connected to the surface of circuit board 312. Mounting contacts 140A, 140B can be pads, wires, pins, or other I/O connection devices. Mounting contacts 140 are preferably provided on the bottom of interconnect device to facilitate mounting to circuit board 312.

As can be seen in FIG. 5, it is not necessary in this embodiment that interconnect device 112 extend from the top of memory stack 304 down to the surface of circuit board 312. This is because all contacts are made from the bottom of interconnect device 112 at end section 104A. Because in this embodiment the electrical signals to mounting contacts 140B may have to extend through thermal conduction layer 208, appropriate insulation is provided where needed. This can be accomplished by routing these signals through insulated vias in thermal conduction layer 208. Alternatively, thermal conduction layer 208 can be omitted in this end section 104A of interconnect device 112. Of course, such omission may have an adverse effect on the heat dissipation characteristics of memory stack 304. In yet another alternative, all I/O signals from memory stack 304 can be routed through contacts 140A.

As with all embodiments described herein, this embodiment can be implemented using rigid sections 104, or it can be implemented using all flexible materials.

5. Double-Sided Die-Mount Embodiments

Figure 7:
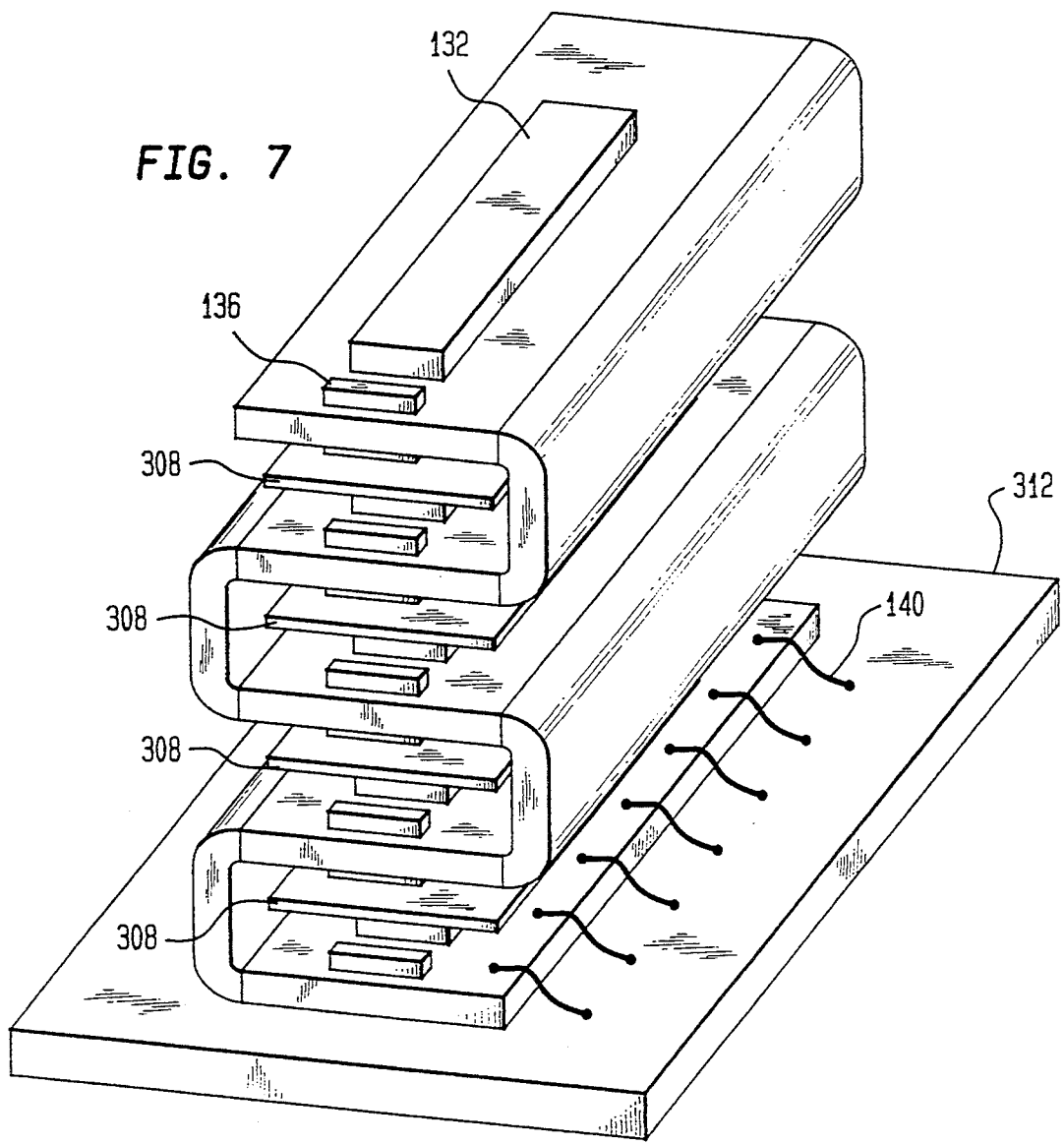
FIG. 7 is a perspective view illustrating a double-sided die-mount embodiment.
Figure 8:
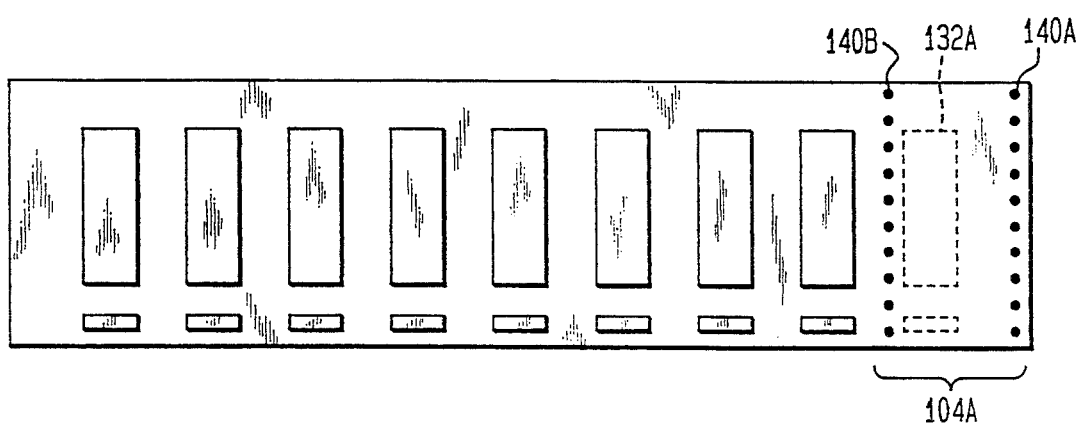
FIG. 8 is a top view of an interconnect device with dice and decoupling capacitors mounted thereon according to the double-sided die-mount embodiment.
Figure 9:
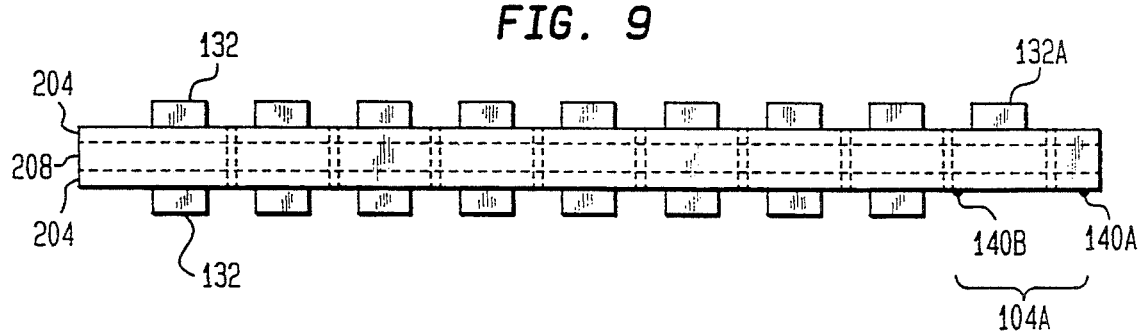
FIG. 9 is a side view of interconnect device with dice and decoupling capacitors mounted thereon according to the double-sided die-mount embodiment.

In the embodiments illustrated in and described with reference to FIGS. 1–6, the dice 132 are mounted on a single-side of interconnect device 112. In alternative embodiments, higher density may be achieved by mounting dice 132 on both sides (top and bottom) of interconnect device 112. A double-sided die-mount embodiment is now described with reference to FIGS. 7, 8, and 9. FIG. 7 is a perspective view illustrating a double-sided die-mount embodiment. FIG. 8 is a top view of interconnect device 112 with die 132 and decoupling capacitor 136 mounted thereon according to the double-sided die-mount embodiment. FIG. 9 is a side view illustrating a double-sided die-mount embodiment.

Referring now to FIGS. 7, 8, and 9, dice 132 are mounted on the top and the bottom of interconnect device 112. Interconnect device 112 is folded in an accordion-like fashion as described above in the other embodiments. Thermal planes 308 can be interposed between each pair of dice 132 to provide additional heat dissipation. A thermal epoxy can be used as an adhesive to secure to folded package together, and the entire package can be encapsulated. As with the other embodiments, interconnect device 112 can be entirely flexible or can include both rigid sections 104 and flexible sections 108. Additionally, this embodiment can be implemented using the single-ended connection method as illustrated in FIG. 5 or the double-ended connection method as illustrated in FIGS. 3 and 4.

As illustrated in FIG. 8, mounting contacts 140A and 140B can be provided at both ends of the end section 104A to provide connection for the single-ended connection method. Note that in the double-sided die-mount embodiment, only one die 132 can be mounted on this end section 104A. This is illustrated in FIG. 9. A die 132 cannot be mounted on the bottom of end section 104, because it is the bottom of this section that is mounted to (printed circuit board 312).

6. Method of Manufacturing the Low-Cost Memory Stack

Figure 10:
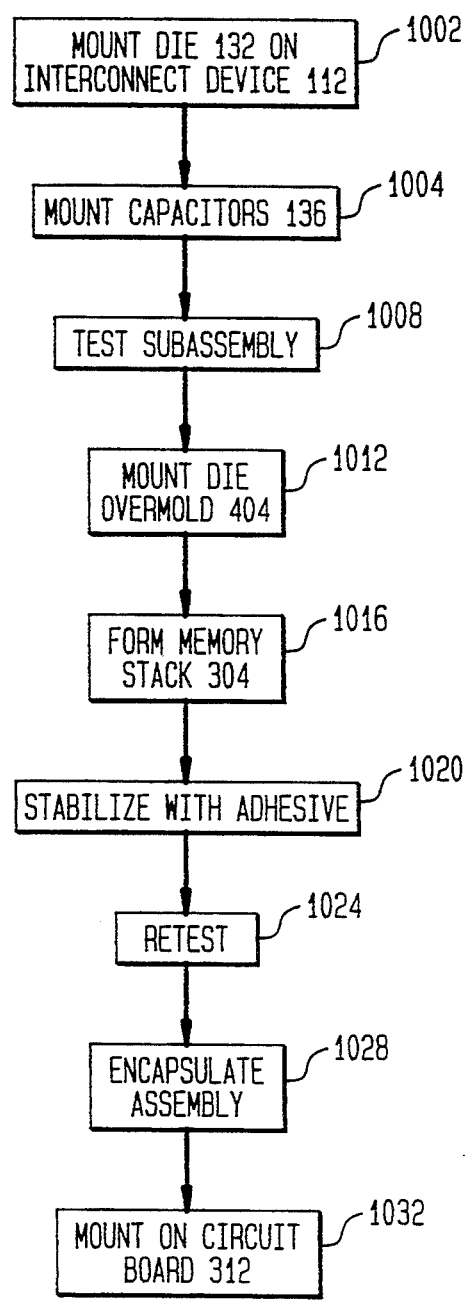
FIG. 10 is a flow chart illustrating a method by which the memory stack of the present invention can be manufactured.

FIG. 10 is a diagram illustrating a method by which the memory stack of the present invention can be manufactured. Referring now to FIG. 10, in a Step 1002 dice 132 are positioned on interconnect device 112 and bonded thereto. The bonding is done, for example, using wire bond, flip chip, or BGA bonding technique. Soldering and other electrical connection methods may also be used. In a Step 1004, decoupling capacitors 136 are mounted on and/or electrically connected to interconnect device 112. In one alternative, decoupling capacitors 136 may be implemented as an integral part of interconnect device 112. Such integrated decoupling capacitors 136 are fully described in U.S. Pat. No. 5,162,977 to Paurus et al., assigned to Storage Technology Corporation in Louisville, Colo., which is incorporated herein by reference in its entirety.

At this point, in a Step 1008, the structure can be tested to verify that each of the die 132 are still functioning properly. A number of different test methods could be used including the mounting of interconnect device 112 into a test jig so that electrical signals can be sent to each die 132 to test the functioning of each memory location. This testing step allows the performance of each die 132 to be validated before further assembly. If a bad die is found, it can be easily and cost effectively replaced at this stage in tile manufacture.

In a Step 1012, a die overmold 404 is mounted over each die 132. This will provide environmental protection to dice 132.

In a Step 1016, interconnect device 112 with dice 132, decoupling capacitors 136 and overmolds 404 mounted thereon is folded to form the stack.

In a Step 1020, the folded stack is stabilized and bonded together using an adhesive material. A thermal adhesive can be used to enhance the conduction of heat away from dies 132.

In a Step 1024, the completed memory stack 304 can be tested again to ensure that each die 132 is functioning properly.

When forming the structure in Step 1016, thermal spreaders 308 may be interposed between the folds to enhance the conduction of heat away from dice 132. Thermal planes 308 may also be inserted between each pair of dice 132.

In a Step 1028, memory stack 304 can be entirely encapsulated to provide additional stability and insulation from the environment.

Once memory stack 304 is fully assembled and tested, it can be mounted on printed circuit board 312. This is illustrated as Step 1032.

7. Conclusion

While various embodiments of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents.

What is claimed is:

1. A memory stack, comprising:
   (a) an interconnect device, comprising
      i. a plurality of rigid sections,
      ii. a plurality of flexible sections connected between said rigid sections,
      iii. a plurality of mounting contacts on each of said rigid sections, and
      iv. a plurality of traces electrically connected to said mounting contacts; and
   (b) a plurality of memory devices, each memory device being mounted on one of said rigid sections of said interconnect device, wherein I/O contacts of said memory devices are electrically connected to said traces of said interconnect device,
   wherein said interconnect device is folded at said flexible sections to form a stack of memory devices.

2. The memory stack of claim 1, wherein said interconnect device further comprises second I/O contacts electrically connected to said traces, wherein said I/O contacts of said memory devices are electrically connected to said traces via said second I/O contacts.

3. The memory stack of claim 1, further comprising an enclosure mounted on each of said rigid sections to cover each of said memory devices.

4. The memory stack of claim 1, further comprising a decoupling capacitor mounted on one of said rigid sections.

5. The memory stack of claim 1, further comprising a decoupling capacitive element integrated into said interconnect device.

6. The memory stack of claim 1, wherein said interconnect device further comprises a thermal conduction layer.

7. The memory stack of claim 6, further comprising a heat sink coupled to said thermal conduction layer.

8. The memory stack of claim 1, wherein said memory devices are mounted on a single side of said interconnect device.

9. The memory stack of claim 1, wherein said memory devices are mounted on both sides of said interconnect device.

10. The memory stack of claim 1, further comprising a thermal plane interposed between folds of said interconnect device.

11. The memory stack of claim 1, further comprising a thermal plane interposed between adjacent memory devices in said memory stack.

12. The memory stack of claim 1, further comprising an interconnect extension extending from the end of said interconnect device at the top of the memory stack.

13. The memory stack of claim 1, wherein said mounting contacts are positioned on a bottom surface of said interconnect device.

14. The memory stack of claim 13, wherein said mounting contacts are further positioned on an end section of said interconnect device.

15. A memory stack, comprising:
   (a) a flexible interconnect device, comprising
      i. a plurality of mounting contacts on said flexible interconnect device,
      ii. a plurality of traces connected to said mounting contacts and forming a first layer of said flexible interconnect device, and
      iii. thermal conduction means for conducting heat, said thermal conduction means forming a second layer of said flexible interconnect device; and
   (b) a plurality of memory devices, each memory device being mounted on said flexible interconnect device, wherein I/O contacts of said memory devices are electrically connected to said traces of said flexible interconnect device, wherein said flexible interconnect device is folded to form a stack of memory devices.

16. The memory stack of claim 15, wherein said flexible interconnect device further comprises second I/O contacts electrically connected to said traces, wherein said I/O contacts of said memory devices are electrically connected to said traces via said second I/O contacts.

17. The memory stack of claim 15, further comprising an enclosure mounted on said flexible interconnect device and covering said memory device.

18. The memory stack of claim 15, further comprising a decoupling capacitive element integrated into said flexible interconnect device.

19. The memory stack of claim 15, further comprising a heat sink coupled to said thermal conduction means.

20. The memory stack of claim 15, wherein said memory devices are mounted on a single side of said flexible interconnect device.

21. The memory stack of claim 15, wherein said memory devices are mounted on both sides of said flexible interconnect device.

22. The memory stack of claim 15, further comprising a thermal plane interposed between folds of said flexible interconnect device.

23. The memory stack of claim 15, further comprising a thermal plane interposed between adjacent memory devices in said memory stack.

24. The memory stack of claim 15, further comprising an interconnect extension extending from the end of said flexible interconnect device at the top of the memory stack.

25. The memory stack of claim 15, wherein said mounting contacts are positioned on a bottom surface of said flexible interconnect device.

26. The memory stack of claim 25, wherein said mounting contacts are further positioned on an end section of said flexible interconnect device.

27. A circuit board having a memory stack, wherein said memory stack comprises:
 (a) a flexible interconnect device, comprising
  i. a plurality of mounting contacts on said flexible interconnect device,
  ii. a plurality of traces connected to said mounting contacts and forming a first layer of said flexible interconnect device, and
  iii. thermal conduction means for conducting heat, said thermal conduction means forming a second layer of said flexible interconnect device; and
 (b) a plurality of memory devices having I/O contacts and mounted on said flexible interconnect device, wherein said I/O contacts of said memory devices are electrically connected to said traces of said flexible interconnect device;
 wherein said flexible interconnect device is folded to form a stack of memory devices.

28. The memory stack of claim 27, wherein said flexible interconnect device further comprises second I/O contacts electrically connected to said traces, wherein said I/O contacts of said memory devices are electrically connected to said traces via said second I/O contacts.

29. The memory stack of claim 27, further comprising a decoupling capacitive element integrated into said flexible interconnect device.

30. A method of manufacturing a memory stack, comprising the steps of:
 (a) mounting a plurality of memory devices on a flexible interconnect structure; and
 (b) folding said flexible interconnect structure so that said memory devices are positioned in a stack
 wherein said flexible interconnect structure includes
  i. a plurality of rigid sections,
  ii. a plurality of flexible sections connected between said rigid sections,
  iii. a plurality of mounting contacts on each of said rigid sections, and
  iv. a plurality of traces electrically connected to said mounting contacts.

31. The memory stack of claim 15, wherein said first layer is interposed between said second layer and said plurality of memory devices.

32. The memory stack of claim 15, wherein said second layer is interposed between said first layer and said plurality of memory devices.

33. The memory stack of claim 27, wherein said first layer is interposed between said second layer and said plurality of memory devices.

34. The memory stack of claim 27, wherein said second layer is interposed between said first layer and said plurality of memory devices.

* * * * *